United States Patent
Tuers et al.

(10) Patent No.: US 9,905,314 B2
(45) Date of Patent: Feb. 27, 2018

(54) STORAGE MODULE AND METHOD FOR DATAPATH BYPASS

(71) Applicant: SanDisk Technologies Inc., Plano, TX (US)

(72) Inventors: Daniel E. Tuers, Kapaa, HI (US); Yoav Weinberg, Thornhill (CA); Yuri Ryabinin, Beer Sheva (IL)

(73) Assignee: SanDisk Technologies LLC, Plano, TX (US)

( * ) Notice: Subject to any disclaimer, the term of this patent is extended or adjusted under 35 U.S.C. 154(b) by 71 days.

(21) Appl. No.: 14/510,892

(22) Filed: Oct. 9, 2014

(65) Prior Publication Data

US 2016/0103732 A1 Apr. 14, 2016

(51) Int. Cl.
| | | |
|---|---|---|
| G11C 29/00 | (2006.01) | |
| G11C 29/52 | (2006.01) | |
| G06F 11/10 | (2006.01) | |
| G11C 29/04 | (2006.01) | |

(52) U.S. Cl.
CPC .......... G11C 29/52 (2013.01); G06F 11/1048 (2013.01); *G11C 2029/0411* (2013.01)

(58) Field of Classification Search
CPC ........... H03M 13/1108; H03M 13/1111; G06F 11/0727; G06F 11/0751; G06F 11/1048
See application file for complete search history.

(56) References Cited

U.S. PATENT DOCUMENTS

| | | | | |
|---|---|---|---|---|
| 4,251,863 | A * | 2/1981 | Rothenberger | G06F 11/1024 714/54 |
| 6,760,878 | B2 * | 7/2004 | Yashima | G11B 20/14 714/755 |
| 2003/0061552 | A1 * | 3/2003 | Su | G11B 20/1816 714/708 |
| 2003/0161245 | A1 * | 8/2003 | Henrichs | G11B 7/12 369/95 |
| 2006/0039196 | A1 * | 2/2006 | Gorobets | G06F 11/106 365/185.01 |
| 2008/0184376 | A1 * | 7/2008 | Selinfreund | G11B 7/00736 726/27 |
| 2009/0282308 | A1 * | 11/2009 | Gutsche | G06F 11/1052 714/746 |
| 2014/0192583 | A1 * | 7/2014 | Rajan | G11C 7/10 365/63 |

* cited by examiner

*Primary Examiner* — Guy Lamarre
(74) *Attorney, Agent, or Firm* — Brinks Gilson & Lione (57) ABSTRACT

A storage module and method for datapath bypass are disclosed. In one embodiment, a storage module begins to perform a read operation that reads a set of code words from the memory and attempts to perform an error detection and correction operation on one of the read code words. In response to determining that the code word has an uncorrectable error, the storage module reads the other code words in the set but bypasses the error detection and correction operation on those other code words. The code word that had the uncorrectable error and the other code words are re-read, wherein at least the code word with the uncorrectable error is re-read with a different read condition. The storage module then attempts to perform the error detection and correction operation on the re-read code words. Other embodiments are provided.

24 Claims, 7 Drawing Sheets

STORAGE MODULE AND METHOD FOR DATAPATH BYPASS

BACKGROUND

When storing data in a storage module, such as a solid state drive (SSD), the data is often stored together with parity bits, and the data and parity bits form what is known as an error correction code (ECC) code word. The process of reading a code word from memory often involves the storage module translating a request to read data from a logical address into various instructions that are needed to actually read the data from a physical address in a memory die. When the read request requires multiple code words to be read from memory, the instructions for these code words are stored in various queues in the storage module, so they can be executed serially to read each code word from the memory die.

After a code word is read from the memory die, the storage module decodes the code word to check for any errors in the data and attempts to correct any such errors. If an error is uncorrectable, the storage module can read the code word again with different read parameters in an attempt to avoid encountering the error. However, if the queues in the storage module store instructions for the other code words to be read, the code word cannot immediately be re-read, as there would be other read instructions ahead of it in the queue. Also, if the storage module operates in a "strict data ordered" environment where code words need to be provided to the host in the same order in which they are read from the memory die, the code word to be re-read cannot be placed at the end of the queue, as that would disrupt the order. So, to re-read the code word, the queues would need to be flushed of the instructions for reading the other code words, so the instruction to re-read the code word can be processed first. After the code word is re-read and decoded without incident, the storage module would re-generate the instructions for the other code words and store them in the queues for execution.

OVERVIEW

Embodiments of the present invention are defined by the claims, and nothing in this section should be taken as a limitation on those claims.

By way of introduction, the below embodiments relate to a storage module and method for datapath bypass. In one embodiment, a storage module begins to perform a read operation that reads a set of code words from the memory and attempts to perform an error detection and correction operation on one of the read code words. In response to determining that the code word has an uncorrectable error, the storage module reads the other code words in the set but bypasses the error detection and correction operation on those other code words. The code word that had the uncorrectable error and the other code words are re-read, wherein at least the code word with the uncorrectable error is re-read with a different read condition. The storage module then attempts to perform the error detection and correction operation on the re-read code words.

In another embodiment, a storage module is provided comprising a memory, a data path, and a context interface module. The data path comprises a plurality of components for processing a set of units of data read from the memory, wherein each component is associated with an instruction queue. In response to an uncorrectable error occurring in one of the units of data read from the memory, the context interface module sets a bypass command in the instruction queues for the components to bypass processing subsequent units of data in the set that are read from the memory, re-reads the unit of data that had the uncorrectable error and the subsequent units of data in the set, wherein at least the unit of data with the uncorrectable error is re-read with a different read condition, and sets a command in the instruction queues for the components to process the re-read units of data.

In another embodiment, a storage module is provided comprising a memory, a first set of queues for storing instructions to read code words from the memory, a second set of queues for storing instructions to process code words read from the memory, and a controller. In response to detecting an uncorrectable error in a code word in a set of code words, the controller is configured to store bypass commands in the second set of queues to bypass processing subsequent code words read from the memory. The controller is also configured to store commands in the first set of queues to re-read the code word that had the uncorrectable error and the subsequent code words, wherein at least the code word with the uncorrectable error is re-read with a different read condition. The controller is further configured to store commands in the second set of queues to process the re-read code words.

Other embodiments are possible, and each of the embodiments can be used alone or together in combination. Accordingly, various embodiments will now be described with reference to the attached drawings.

DETAILED DESCRIPTION OF THE PRESENTLY

Preferred Embodiments

As discussed above, in a "strict data ordered" environment, code words in a set need to be provided to the requestor in the same order in which they are read from the memory. When an uncorrectable error occurs in one of the code words, queues in the storage module that contain instructions to read other code words in the set need to be flushed (erased) to avoid reading the code words out of order. After the code word is re-read, the storage module would re-generate the instructions for the other code words in the set and store them in the queues for execution. This requirement of flushing and rebuilding queues can result in a large delay penalty for a single decode failure. The following embodiments can be used to increase performance by reducing system latency when a decode failure is encountered. Before turning to these and other embodiments, the following paragraphs provide a discussion of exemplary storage modules that can be used with these embodiments. Of course, these are just examples, and other suitable types of storage modules can be used.

Figure 1:
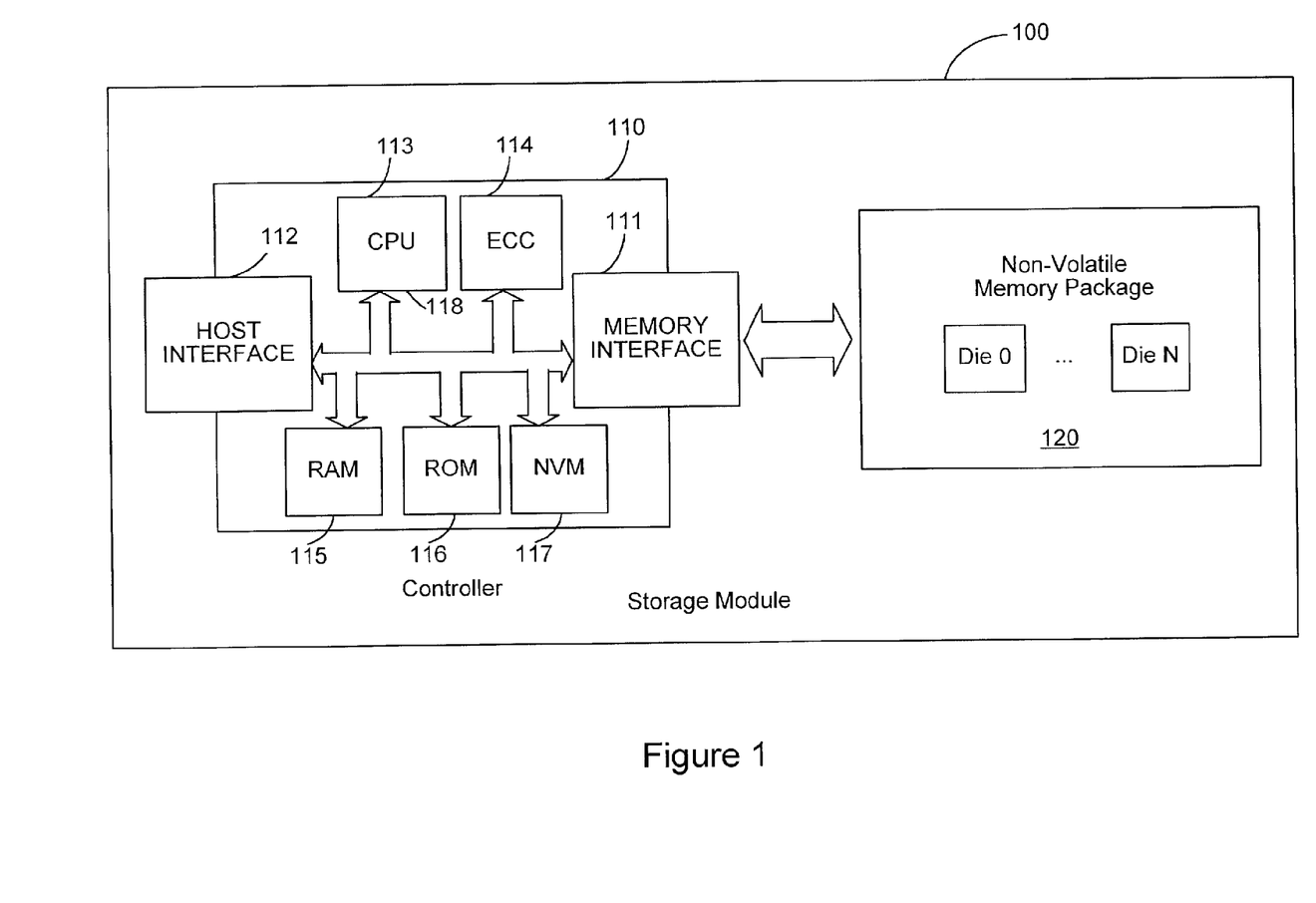
FIG. 1 is a block diagram of an exemplary storage module of an embodiment.

As illustrated in FIG. 1, a storage module 100 of one embodiment comprises a storage controller 110 and a non-volatile memory package 120 containing a plurality of memory dies (Die 0 to Die N). Although only one non-volatile memory package is shown in FIG. 1, it should be understood that the storage module 100 can have more than one non-volatile memory package. Also, while multiple memory dies are shown, it should be understood that a single memory die can be used. As will be discussed below, the memory dies can be implemented with any suitable technology, including, but not limited to, NAND, bit cost scaling (BiCs) memory, and resistive random-access memory (Re-RAM).

The storage controller 110 comprises a memory interface 111 for interfacing with the non-volatile memory package 120 and a host interface 112 for placing the storage module 100 operatively in communication with a host controller. As used herein, the phrase "operatively in communication with" could mean directly in communication with or indirectly in (wired or wireless) communication with through one or more components, which may or may not be shown or described herein.

Figure 2A:
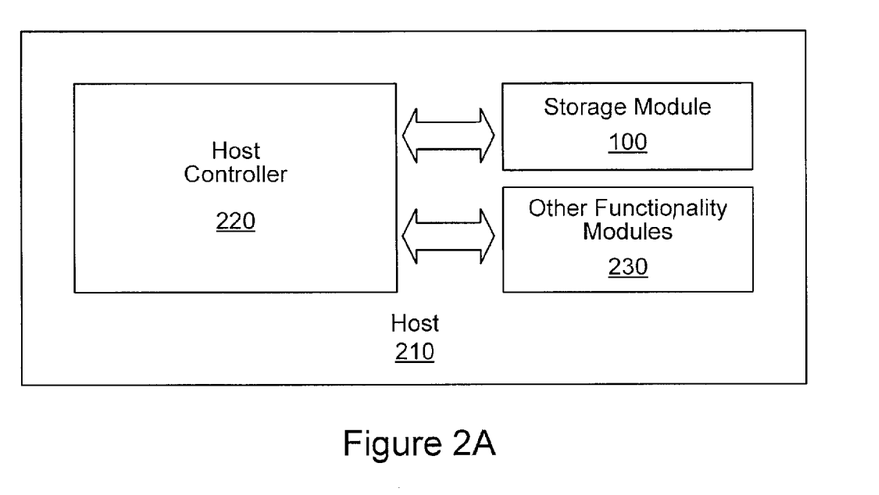
FIG. 2A is a block diagram of a host of an embodiment, where the exemplary storage module of FIG. 1 is embedded in the host.

As shown in FIG. 2A, the storage module 100 can be embedded in a host 210 having a host controller 220. That is, the host 210 embodies the host controller 220 and the storage module 100, such that the host controller 220 interfaces with the embedded storage module 100 to manage its operations. For example, the storage module 100 can take the form of an iNAND™ eSD/eMMC embedded flash drive by SanDisk Corporation, storage devices that use NVMe, SAS and SATA host interfaces, or, more generally, any type of solid state drive (SSD) (e.g., an enterprise solid-state storage device), a hybrid storage device (having both a hard disk drive and a solid state drive), and a memory caching system. The host controller 220 can interface with the embedded storage module 100 using, for example, an eMMC host interface or a UFS interface. The host 210 can take any form, such as, but not limited to, a mobile phone, a tablet computer, a digital media player, a game device, a personal digital assistant (PDA), a mobile (e.g., notebook, laptop) personal computer (PC), or a book reader. As shown in FIG. 2A, the host 210 can include optional other functionality modules 230. For example, if the host 210 is a mobile phone, the other functionality modules 230 can include hardware and/or software components to make and place telephone calls. As another example, if the host 210 has network connectivity capabilities, the other functionality modules 230 can include a network interface. Of course, these are just some examples, and other implementations can be used. Also, the host 210 can include other components (e.g., an audio output, input-output ports, etc.) that are not shown in FIG. 2A to simplify the drawing. It should be noted that while the host controller 220 can control the storage module 100, the storage module 100 can have its own controller to control its internal memory operations. Also, in general, a host controller can be any controller capable of interfacing with the storage module, be it a controller in monolithic form, an entire controller, or a separate functionality module.

Figure 2B:
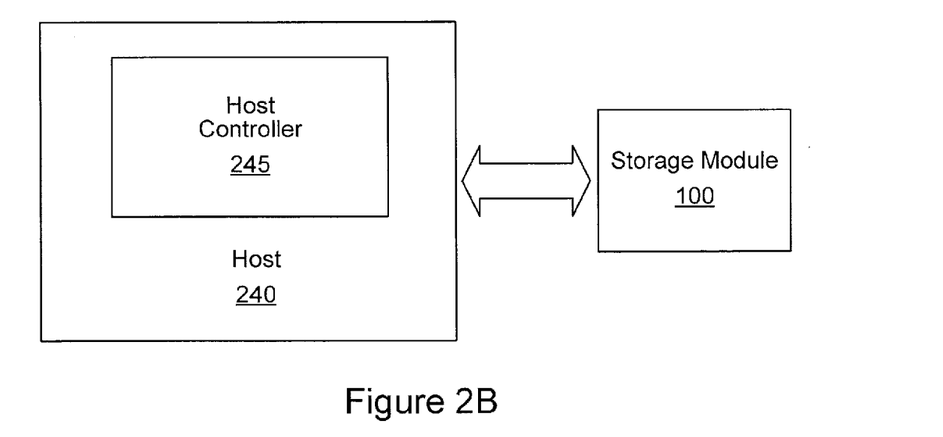
FIG. 2B is a block diagram of the exemplary storage module of FIG. 1 removably connected to a host, where the storage module and host are separable, removable devices.

As shown in FIG. 2B, instead of being an embedded device in a host, the storage module 100 can have physical and electrical connectors that allow the storage module 100 to be removably connected to a host 240 (having a host controller 245) via mating connectors. As such, the storage module 100 is a separate device from (and is not embedded in) the host 240. In this example, the storage module 100 can be a handheld, removable memory device, such as a Secure Digital (SD) memory card, a microSD memory card, a Compact Flash (CF) memory card, a universal serial bus (USB) device (with a USB interface to the host), or a solid-state drive (SSD), and the host 240 is a separate device, such as a mobile phone, a tablet computer, a digital media player, a game device, a personal digital assistant (PDA), a mobile (e.g., notebook, laptop) personal computer (PC), or a book reader, for example.

In FIGS. 2A and 2B, the storage module 100 is in communication with a host controller 220 or host 240 via the host interface 112 shown in FIG. 1. The host interface 112 can take any suitable form, such as, but not limited to, an eMMC host interface, a UFS interface, and a USB interface. The host interface 110 in the storage module 110 conveys memory management commands from the host controller 220 (FIG. 2A) or host 240 (FIG. 2B) to the storage controller 110, and also conveys memory responses from the storage controller 110 to the host controller 220 (FIG. 2A) or host 240 (FIG. 2B). Also, it should be noted that when the storage module 110 is embedded in the host 210, some or all of the functions described herein as being performed by the storage controller 110 in the storage module 100 can instead be performed by the host controller 220.

Returning to FIG. 1, the storage controller 110 comprises a central processing unit (CPU) 113, an error correction code (ECC) module 114 operative to encode and/or decode an ECC code word with data and parity bits, read access memory (RAM) 215, read only memory (ROM) 116 which can store firmware for the basic operations of the storage module 100, and a non-volatile memory (NVM) 117 which can store a device-specific key used for encryption/decryption operations, when used. The storage controller 110 can be implemented in any suitable manner. For example, the storage controller 110 can take the form of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example. Suitable controllers can be obtained from SanDisk or other vendors. The storage controller 110 can be configured with hardware and/or software to perform the various functions described below and shown in the flow charts. Also, some of the components shown as being internal to the storage controller 110 can also be stored external to the storage controller 110, and other component can be used. For example, the RAM 115 (or an additional RAM unit) can be located outside of the controller die and used as a page buffer for data read from and/or to be written to the memory package 120.

The memory dies in the non-volatile memory package 120 can also take any suitable form. For example, in one embodiment, one or more of the memory dies take the form of a solid-state (e.g., flash) memory and can be one-time programmable, few-time programmable, or many-time programmable. The memory dies can also use single-level cell (SLC), multiple-level cell (MLC), triple-level cell (TLC), or other memory technologies, now known or later developed. Also, the memory dies can be a two-dimensional memory or a three-dimensional memory.

As mentioned above, when storing data in the storage module 100, the data is often stored together with parity bits, and the data and parity bits form what is known as an error correction code (ECC) code word. As used herein, an ECC code word refers to a unit that contains the data itself and ECC parity bits that can be used by the ECC engine to decode the code word to determine if an error exists in the code word and possibly correct the error.

Figure 3:
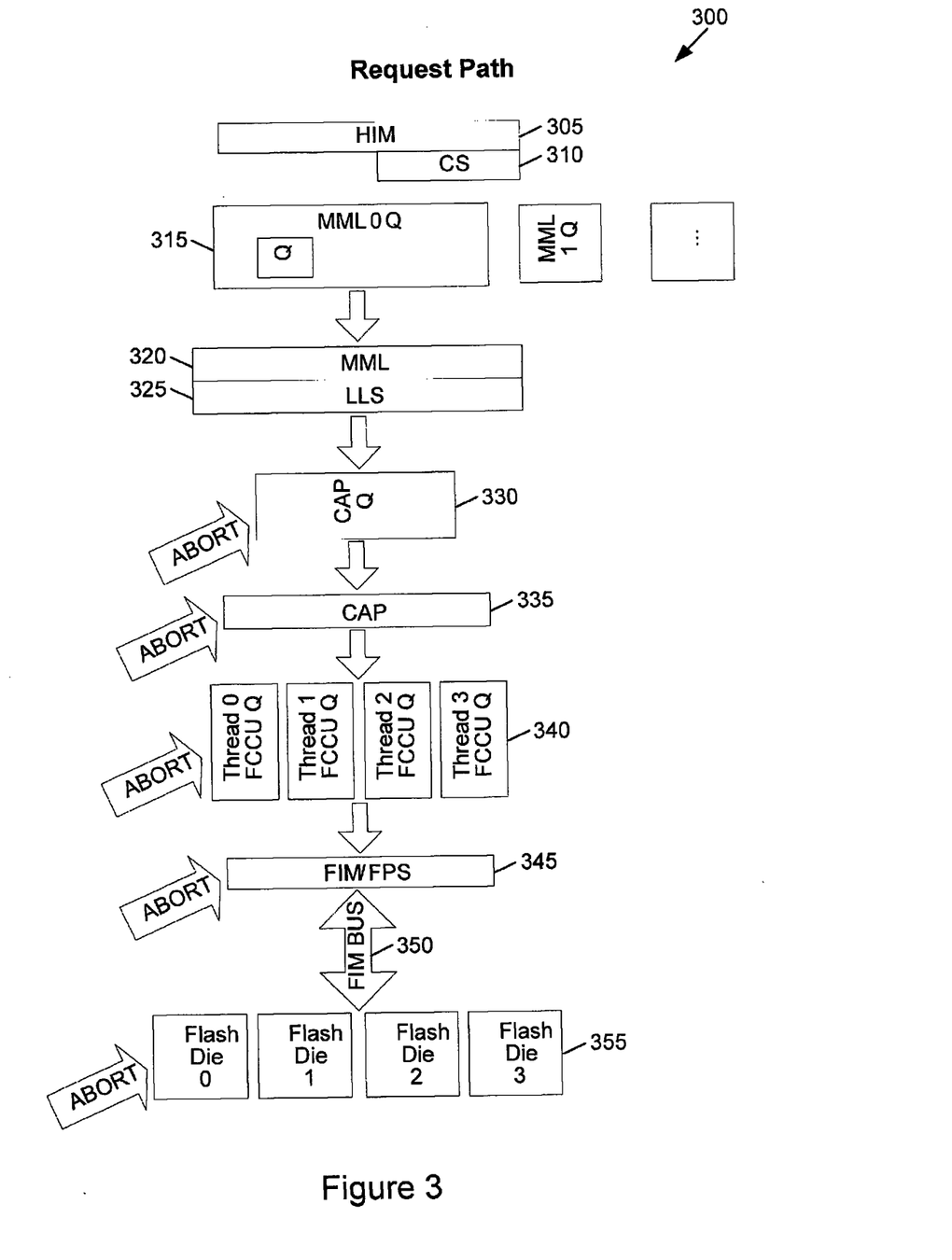
FIG. 3 is a diagram of a request path, where queues are flushed in response to a decode failure.
Figure 4:
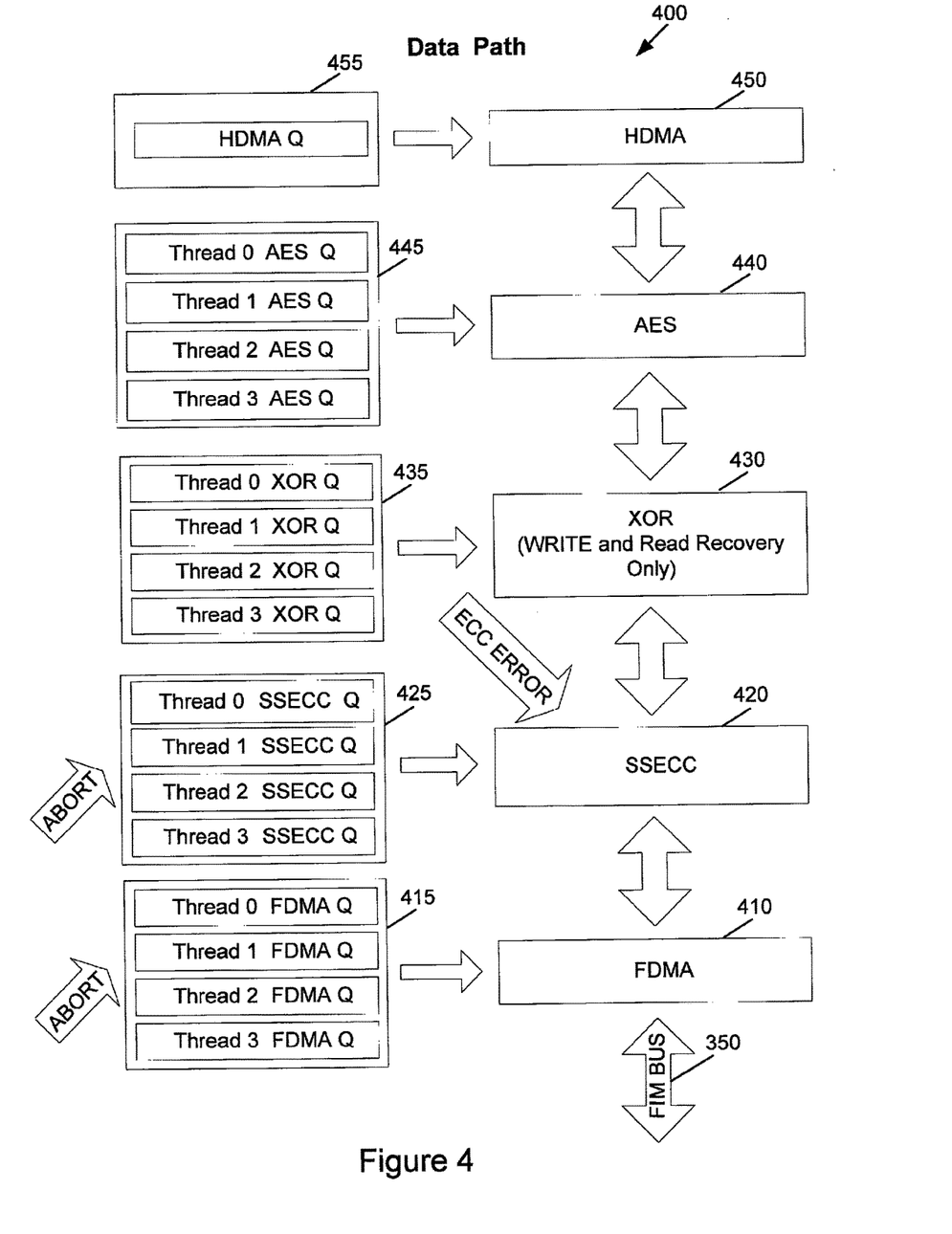
FIG. 4 is a diagram of a data path, where queues to an ECC engine and flash DMA are flushed in response to a decode failure.

The process of reading a code word from memory often involves the storage module translating a request to read data from a logical address into various instructions that are needed to actually read the data from a physical address in a memory die. When multiple code words are to be read to satisfy the read request, the instructions for these code words are stored in various queues in the storage module, so they can be executed serially to read each code word from the memory die. FIGS. 3 and 4 illustrate this read process and are described below.

FIG. 3 is a diagram of an exemplary request path 300 in a storage module of an embodiment. The request path 300 is the path that a read request takes from when it is received (e.g., from a host or an internal requestor) to when it is delivered to a flash die in the memory. As shown in FIG. 3, the request path 300 in this embodiment comprises a host interface module (HIM) 305 with a command sequencer (CS) 310, a plurality of media management layer (MML) queues 315, a media management layer (MML) 320, a low-level sequencer (LLS) 325, a context automation processor (CAP) queue 330, a context automation processor (CAP) 335, a plurality of fault collection and control unit (FCCU) queues 340, a flash interface module (FIM)/flash protocol sequencer (FPS) 345, a FIM bus 350, and a plurality of flash dies 355. This is one particular implementation of the storage module 100 in FIG. 1, with the HIM 405 corresponding to the host interface 112, the FIM 445 corresponding to the memory interface 114, and the intervening component being in the CPU 113 and/or in other modules in the controller 110.

In operation, the HIM 305 (e.g., a SATA or NVMe) receives a read command (e.g., from a host or an internal requestor). The write command can take any suitable format and, in one embodiment, contains a logical block address to be read and specifies a "length" of data to be read. The command sequencer (CS) 310 is used when multiple FIM buses are used to multiple memory packages. For example, FIG. 3 shows a single FIM bus 350 to one memory package (i.e., one channel). If multiple memory packages are used, there would be multiple FIM busses (e.g., 4 or 8 channels), and the command sequencer (CS) 310 would be responsible for fanning-out various write requests to the various busses and then fanning-in the data read from those requests. The MML (media management layer) queue 315 stores the read requests that the command sequencer (CS) 310 fans out to that particular channel, and the MML (media management layer) performs logical-to-physical address translation on the logical address in the read command. The low-level sequencer (LLS) 325 sequences these translated requests and puts them into the context automation processor (CAP) queue 330.

The context automation processor (CAP) 335 pulls the requests from the CAP queue 330, translates the physical address provided by the MML 320 to a flash die address, and then generates the context (instructions) that will later be run to perform the read command on the specific address in the flash die. The CAP 335 stores the contexts in the FCCU queues 340 associated with the appropriate die. The flash interface module (FIM)/flash protocol sequencer (FPS) 345 is a co-processor that pulls contexts from the FCCU queues 340 and manages the FIM bus 350 to send read commands to the appropriate flash die to read data. It should be noted that while the above request path was discussed in terms of a read request, other types of requests can be used. Also, each of the dies can be doing independent operations (e.g., one die doing a cache read, another die doing an erase, another die doing a write cache, etc.).

When data is read from a flash die, it follows a data path 400 from the flash die to the host. As shown in FIG. 4, in one embodiment, the data path 400 comprises an flash direct memory access (FDMA) controller 410 and associated set of queues 415, an ECC engine (e.g., a super strong error correction code (SSECC) unit) 420 (which can correspond to the ECC engine 114 in FIG. 1 (e.g., an LDPC engine) and associated set of queues 425, an XOR unit 430 and associated set of queues 435, an encryption (such as an Advanced Encryption System (AES)) unit 440 and associated set of queues 445, and a host direct memory access (HDMA) controller 450 and associated set of queues 455.

In operation, a data path sequencer (DPS) (not shown) generates contexts (instructions) for each of the components on the right side of the figure to perform various data processing functions on the read data (e.g., error correction, decryption) and stores the contexts for the components in their associated queues. Each queue stores multiple threads, with each thread corresponding to a particular die. In this embodiment, in each of the queues, there is one context per ECC code word, and each queue is many levels deep.

To simplify this example, let's consider one thread (e.g., Thread 1), and let's assume that the contexts in Thread 1 are to read a set of 10 ECC code words. For the first code word, the FDMA engine 410 would manage the FIM bus 450 to read the first code word from the flash die. The ECC engine 420 would decode the code word to detect any error and attempt to correct it. The XOR engine 430 is typically just used in a write operation (or for read recovery), so it would not process the code word. The encryption/AES engine 440 would decrypt the code word and then store the decrypted code word in a buffer (not shown). The HDMA engine 450 would read the decrypted code word from the buffer and provide it to the host device. This process is repeated for the other code words in the thread in a serial manner (e.g., while the AES engine 440 is decrypting the first code word, the ECC engine 420 can be decoding the second code word). When all the read code words are stored in the buffer, the HDMA 450 sends all 10 code words to the host.

In this embodiment, the storage module 100 operates in a "strict data ordered" environment where code words need to be provided to the host in the same order in which they are read from the memory die. So, if the ECC engine 420 determines that there is an uncorrectable error in a code word, that code word would need to be re-read but before the other code words in the thread are read. This means that the storage module 100 would need to abort any read operations occurring on that die and flush the various queues and components, so that no further processing is performed on the uncorrectable code word or the subsequent code words in the thread. For example, if code word 3 in the thread contains an uncorrectable error, the contexts for that code word and the contexts for code words 4-10 are flushed (erased) from the FDMA and ECC queues 415, 425 in the data path 400, and the CAP Q 330, CAP 335, FCCU queue 340, and FIM/FPS 345 in the request path 300. (In this embodiment, the abort happens on a particular thread, and the other threads can be left running. Not all system implementations support threads in the request paths and datapaths.)

The read request for code word 3 is then rebuilt in those components, but, this time, the LLS 325 alters the contexts in the request path 300 to help improve the chances of avoiding an uncorrectable error in code word 3. For example, the LLS 335 can recalibrate how the sense is performed on the flash die, can select a different mode to help avoid errors (e.g., a clean sense mode to avoid errors from neighboring pages), using soft bits (extra information on how close the bit is to cross-over (how reliable the bit is). This may be an iterative process until code word 3 passes the ECC engine 420. After code word 3 passes the ECC engine 420, the storage module re-generates the requests for code words 4-10 and rebuilds the queues. When code words 4-10 are eventually stored in the buffer, all 10 code words are sent to the host.

While the above process allows the storage module 100 to operate in a "strict data ordered" environment, flushing the queues upon a decode failure and then rebuilding the queues later can result in a large delay penalty for a single decode operation. For example, if the original requests have been removed from the queues, the firmware must figure out what operations were flushed from the datapath queues and request queues, reconstruct the hardware descriptors, and re-queue them after the decode failure. If the hardware supports a secondary request queue, then the system would still require the datapath queue to be flushed to prioritize the retry requests. Additional problems include pausing/shutting down the datapath engines, context generators, and flash channels in order to avoid a race condition with the hardware engines when doing queue modification operations. Additional complications can occur if there are shared datapath resources in abort operations.

The following embodiment can be used to avoid the delay penalty in flushing and rebuilding queues upon a decode failure. In general, with this embodiment, if an uncorrectable error is encountered, instead of flushing queues to prevent other code words from being read, those other code words are allowed to be read but the post-read processing steps (e.g., error detection and correction, XOR recovery, and decryption) are bypassed.

Figure 5:
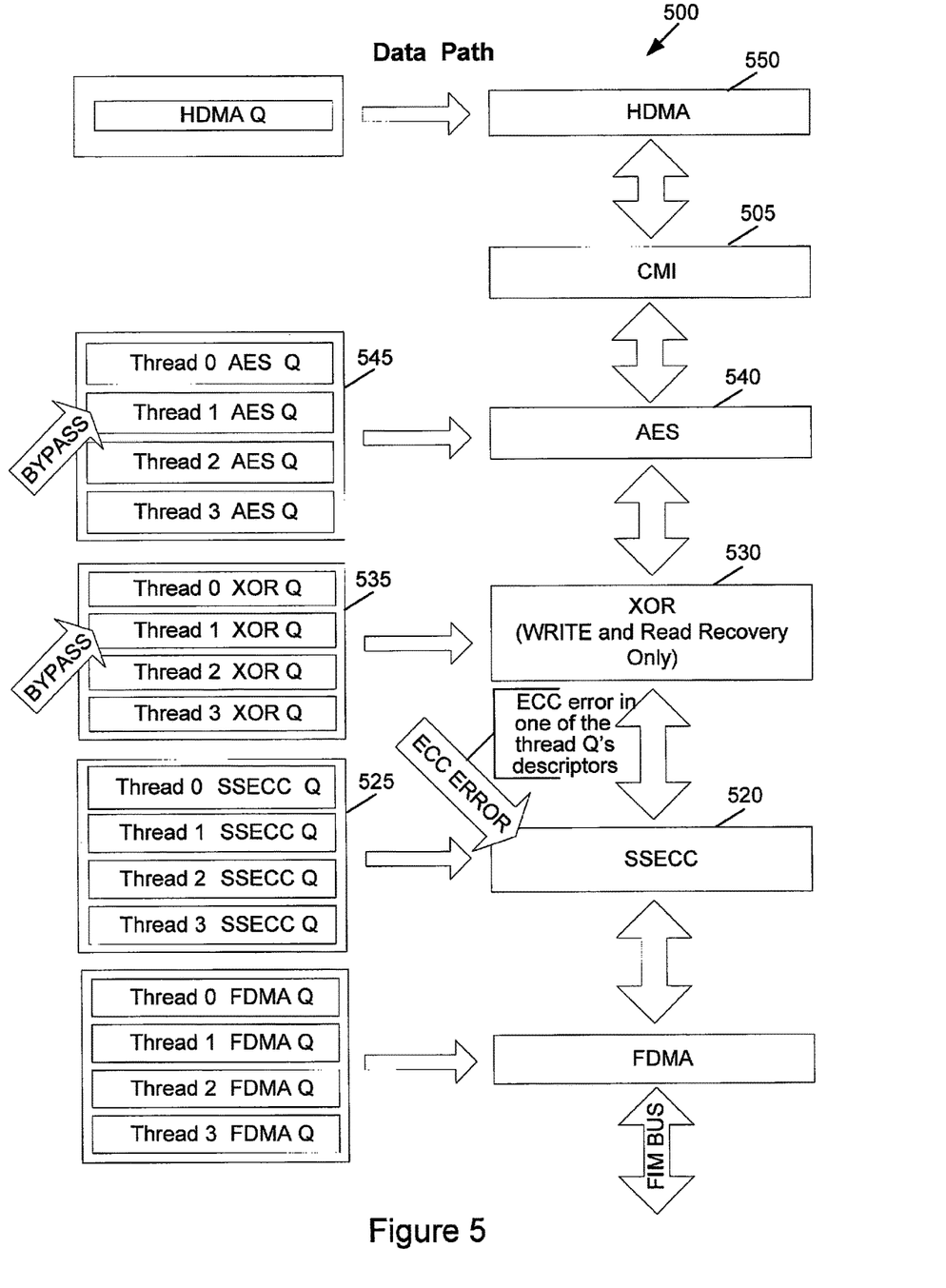
FIG. 5 is a diagram of a data path of an embodiment, where queues to an encryption engine and XOR engine are flushed in response to a decode failure.

FIG. 5 shows a data path 500 that illustrates this operation. As shown in FIG. 5, when the ECC engine 520 encounters an uncorrectable error, the system instructs the XOR engine 530 and the AES engine 540 (e.g., using a bypass flag in the descriptor fields of the XOR and AES queues 535, 545) to bypass the recovery and decryption operations on that code word. In this embodiment, the data path 500 contains a cache manager interface (CMI) 505 that acts as a "gatekeeper" to the HDMA 550, so only a complete set of code words for the read operation will be sent. (In one implementation, the CMI is a processor.) So, in this example, the decryption operation was bypassed for the code word with the uncorrectable error, the CMI 505 would not pass this code word on to the HDMA 550. If the system is a strict data ordered system, the CMI 505 would also prevent any code words from being sent out of order. The other code words in the set are read from the memory. However, the post-read processing of these code words are also bypassed (including the error detection and correction operation). The CMI 505 would also know that this other code words were not processed and would not pass these code words to the HDMA 550.

The code word that had the uncorrectable error and the subsequent code words are later re-read from the memory (e.g., using different read conditions for at least the code word that had the uncorrectable error) and then processed. This would involve building the queues in the request path for the reads. However, for at least the code word with the uncorrectable error, the read conditions for that code word can be changed in an attempt to avoid the uncorrectable error. If there is still an uncorrectable error in the same or different code word, the above process can be re-performed. Otherwise, the CMI 505 assembles all of the code words in the set in the proper order and then releases them to the HDMA 550. In other words, to maintain "strict data ordered" coherency, the storage module 100 can wait until all of the code words are read and processed before providing the entire set of code words (e.g., to the host) as a response to the read command.

Figure 6:
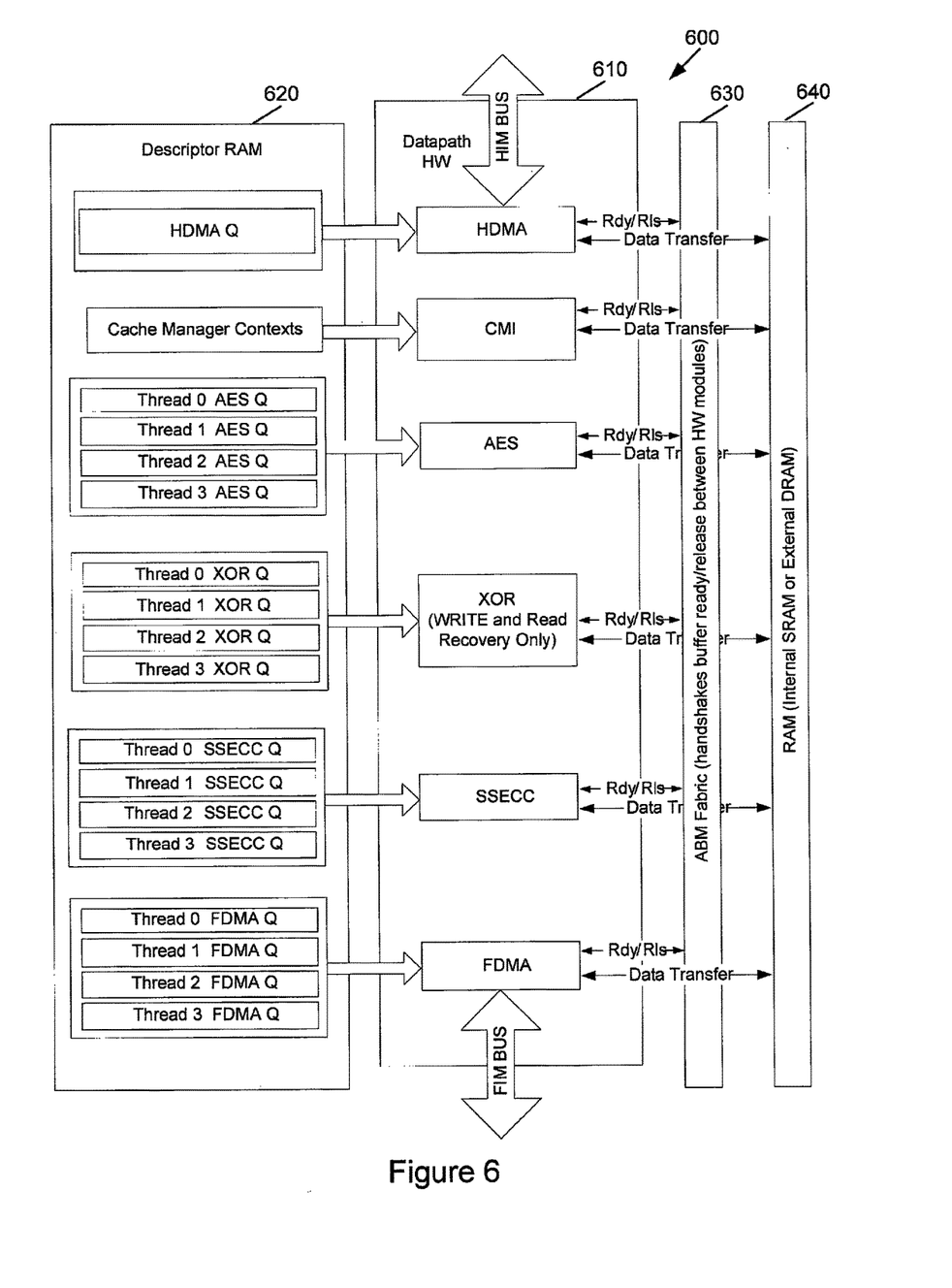
FIG. 6 is a diagram of a descriptor RAM and datapath hardware of an embodiment.
Figure 7:
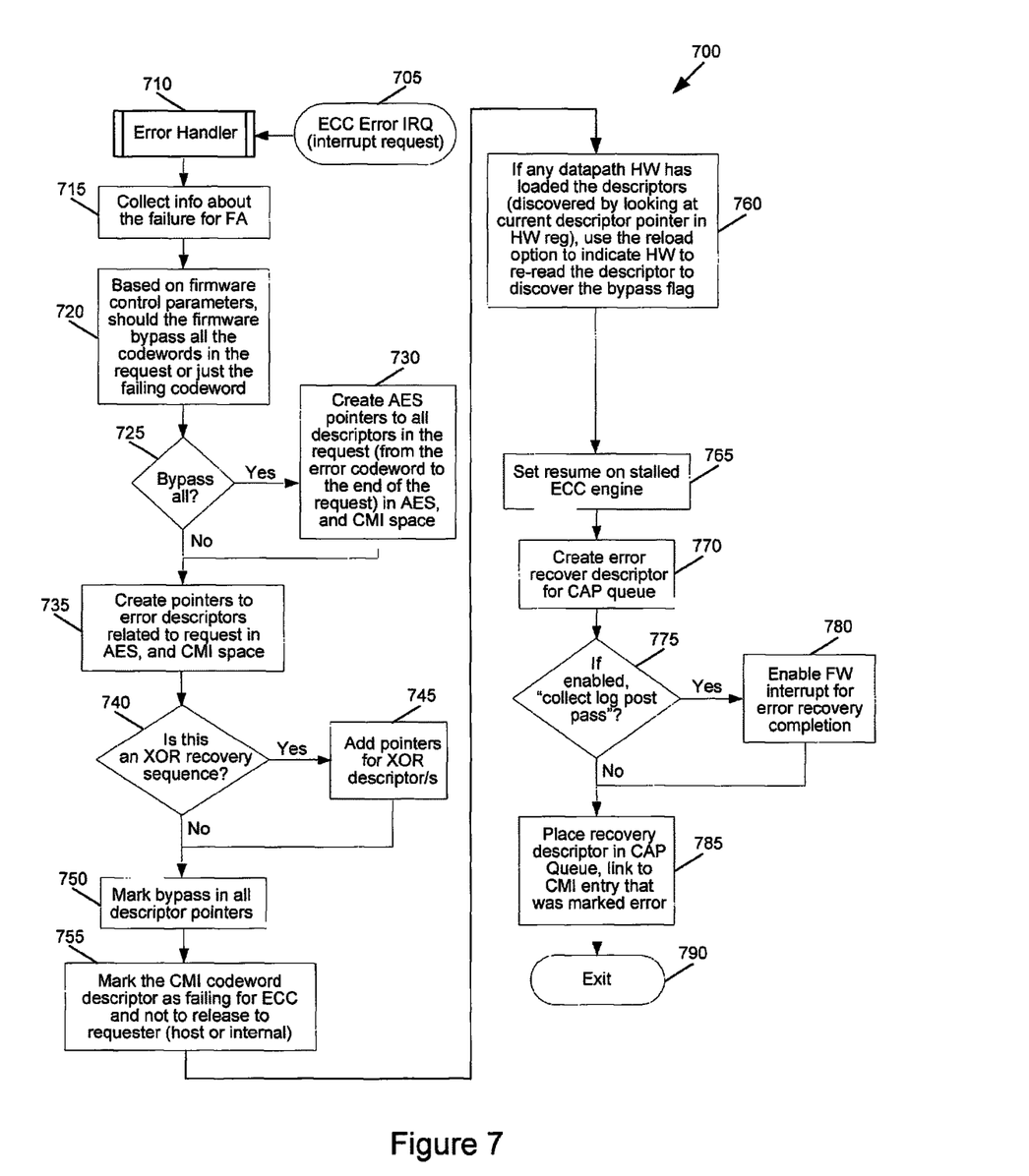
FIG. 7 is a flow chart of a method of an embodiment for error datapath bypass.

FIGS. 6 and 7 are a diagram 600 and flow chart 700 that provide one particular implementation of this embodiment. Of course, this is just one example, and other implementations are possible. As shown in FIG. 6, in this example, the system contains both a datapath 610 and a descriptor RAM 620 that stores various queues for the hardware in the datapath. The system also contains ABM fabric 630 that handshakes a buffer ready/release signal between the hardware modules and a RAM 640 (e.g., an internal SRAM and an external DRAM) that stores data transferred to it by the hardware modules in the datapath 610.

As shown in FIG. 7, when the ECC engine sends an interrupt request (act 705) to an error handler (e.g., software or hardware in the controller) 710, information about the failure is collected for future analysis (act 715). The information reported to firmware can include information, such as, but not limited to, the request ID (tag), which code word within the set of code words associated with the request contained the error (the FMU number within the request), the failure's physical location, and decode failure characterization information (e.g., the number of iterations the ECC engine went through, the syndrome weight, bit error rate, whether early termination occurred, decode power mode used (e.g., ultra-low power (ULP), low power (LP), or full power (FP)). The ECC engine could be configured to log the failure information in a decode failure log buffer and flag the problem to firmware through an interrupt and a "sticky" decode failure flag register.

Based on the firmware control parameters, the firmware in the controller decides whether it should bypass all the code words in the read request (e.g., an entire word line because the entire word line was sensed with the same thresholds) or just the failing code word (acts 720 and 725). If all the code words are to be bypassed, the controller creates AES pointers to all descriptors in the request (from the error code word to the end of the request) in the AES and CMI space (act 730). Otherwise, the controller creates pointers to the error descriptors related to the code word that contained the error in the AES and CMI space (act 735). Then, the controller determines if this is an XOR recovery sequence (act 740). If it is, the controller adds pointers to the XOR descriptor(s) (act 745). Otherwise, the controller marks the bypass flag in all the descriptor pointers (act 750). If these associated engines have already read the descriptor, a reload option is used to tell the engine to re-read the descriptor from RAM space.

The controller then marks the CMI code word descriptor as failing for ECC, so it is not to be released to the request (e.g., the host or an internal requestor) (act 755). In this way, the CMI is informed that this request may get released by the datapath, but it will be incomplete because of a partial failure. This keeps the data from being released for internal processing (for example, the flash translation layer (FTL)) or released to the host interface. Next, if any datapath hardware has loaded the descriptors (discovered by looking at the current descriptor pointer in the hardware register), the controller can use the reload option to indicate to the hardware to re-read the descriptor to discover the bypass flag (act 760). The controller then resumes the stalled ECC engine (act 765) and creates an error recover descriptor for the CAP queue (act 770). When the ECC engine resumes, the ECC engine realizes the bypass feature is set in the descriptor, skips processing the decode, and releases the source and destination buffers. The controller then checks the "collect log post pass" indicator, if it is enabled (act 775) and either enables the firmware interrupt for error recovery completion (act 780) or places a recovery descriptor in the CAP queue that is linked to the CMI entry that was marked error (act 785). The method then exits (act 790).

As shown in this example, even when there is an error in one of the code words, the datapath continues processing all descriptors in the queue, and no flushing is done on any requests between the flash interface and the ECC engine. The firmware puts a decode retry into the queue behind all other requests (this could include calibration reads, DLA on setting, hard/soft bit reads, etc.). When the retry completes successfully, firmware is notified via a completion ISR and modifies the datapath endpoint to release the entire request of which the decode failure occurred. A delta implementation could avoid the second firmware interrupt of this step and have the hardware automatically release the request.

There are several advantages associated with these embodiments. As mentioned above, because queues in the request path are not flushed and rebuilt when there is a decode failure, these embodiments avoid the delay penalty encountered in other systems. This can be particularly important in situations when adaptive trimming is used, as adaptive trimming can push the error rate higher earlier in life, such that the correction capability of the memory device is extended beyond its capability much sooner than normal end of life. Also, in some products, the marketed performance of a device must not deviate more than a certain percentage (e.g., 10%) over the life of the device. This could mean that the performance in the later part of the device's life could bring down the marketed performance metric. Any significant frequency of the error rate pays a penalty in the marketed performance, and the above embodiment can be used to avoid the problem.

There are several alternatives that can be used with these embodiments. First, while the above examples were focused on ECC and XOR failures, there could be other failures that can cause the datapath to cancel selective entries in the queue. These other failures can include, but are not limited to, program failures, problems with the voltage detector (VDET), and temperature issues. Also, the number of queues to the datapath cores, CAP, FIM, and other blocks do not need to match the number of dies (there can be one, two, or many), and there can be a different number of queues per hardware/firmware component.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method for datapath bypass, the method comprising: performing the following in a storage module comprising a memory:
   performing an error detection and correction operation on a code word read from the memory, wherein the code word is part of a set of code words; and
   in response to determining that the code word has an uncorrectable error:
      reading the other code words in the set but bypassing the error detection and correction operation on those other code words;
      re-reading the code word that had the uncorrectable error with a different read condition; and
      performing the error detection and correction operation on the re-read code words.

2. The method of claim 1, wherein the storage module comprises at least one queue for storing instructions to read the set of code words from the memory, and
   wherein the method further comprises:
      re-reading the other code words; and
      performing the error detection and correction operation on the re-read other code words;
   wherein by reading the other code words, the method avoids flushing the at least one queue in response to the uncorrectable error.

3. The method of claim 1, wherein the storage module is configured to perform at least one additional processing operation, and wherein the method further comprises bypassing the at least one additional processing operation in response to determining that the code word has an uncorrectable error.

4. The method of claim 3, wherein the at least one additional processing operation comprises a decryption operation.

5. The method of claim 3, wherein the storage module comprising a plurality of queues containing instructions to instruct components in the storage module to perform the at least one additional processing operation, and wherein the at least one additional processing operation is bypassed by setting a bypass command in the instructions.

6. The method of claim 3 further comprising waiting until all the code words in the set have been read and additionally processed before releasing the set of code words as a response to a read command.

7. The method of claim 1, wherein the memory is a three-dimensional memory.

8. The method of claim 1, wherein the storage module is embedded in a host.

9. The method of claim 1, wherein the storage module is removably connected to a host.

10. The method of claim 1, wherein the storage module is a solid-state drive.

11. A storage module comprising:
   a memory;
   a data path comprising a plurality of components for processing a set of units of data read from the memory, wherein each component is associated with an instruction queue; and
   a context interface module configured to perform the following in response to an uncorrectable error occurring in one of the units of data read from the memory:

set a bypass command in the instruction queues for the components to bypass processing subsequent units of data in the set that are read from the memory;

re-read the unit of data that had the uncorrectable error and the subsequent units of data in the set, wherein at least the unit of data with the uncorrectable error is re-read with a different read condition; and set a command in the instruction queues for the components to process the re-read units of data.

12. The storage module of claim 11, wherein the context interface module is further configured to wait until all the units of data have been re-read and processed before releasing any of the units of data as a response to a read command.

13. The storage module of claim 11, wherein the plurality of component in the data path comprise an error correction code engine and a decryption engine.

14. The storage module of claim 11, wherein the memory is a three-dimensional memory.

15. The storage module of claim 11, wherein the storage module is embedded in a host.

16. The storage module of claim 11, wherein the storage module is removably connected to a host.

17. The storage module of claim 11, wherein the storage module is a solid-state drive.

18. A storage module comprising:
a memory;
a first set of queues for storing instructions to read code words from the memory;
a second set of queues for storing instructions to process code words from the memory; and
a controller in communication with the memory and the first and second sets of queues, wherein the controller is configured to perform the following in response to detecting an uncorrectable error in a code word in a set of code words:

store bypass commands in the second set of queues to bypass processing subsequent code words read from the memory, wherein the subsequent code words are read from the memory in accordance with the instructions stored in the first set of queues;

store commands in the first set of queues to re-read the code word that had the uncorrectable error and the subsequent code words, wherein at least the code word with the uncorrectable error is re-read with a different read condition; and store commands in the second set of queues to process the re-read code words.

19. The storage module of claim 18, wherein the controller is further configured to wait until all the code words have been re-read and processed before releasing any of the code words as a response to a read command.

20. The storage module of claim 18, wherein code words are processed by one or both of an error correction code engine and a decryption engine.

21. The storage module of claim 18, wherein the memory is a three-dimensional memory.

22. The storage module of claim 18, wherein the storage module is embedded in a host.

23. The storage module of claim 18, wherein the storage module is removably connected to a host.

24. The storage module of claim 18, wherein the storage module is a solid-state drive.

* * * * *